US005849464A

United States Patent [19]

Yokoya et al.

[11] Patent Number: 5,849,464

[45] Date of Patent: Dec. 15, 1998

[54] METHOD OF MAKING A WATERLESS LITHOGRAPHIC PRINTING PLATE

[75] Inventors: Hiroaki Yokoya; Tsumoru Hirano; Toshifumi Inno, all of Shizuoka-ken, Japan

[73] Assignee: Fuji Photo Film Co., Ltd., Minami-ashigara, Japan

[21] Appl. No.: 899,305

[22] Filed: Jul. 23, 1997

[30] Foreign Application Priority Data

Jul. 25, 1996 [JP] Japan .................................... 8-214232

[51] Int. Cl.$^{6}$ ........................................................ G03F 7/26

[52] U.S. Cl. ............................................ 430/303; 430/944

[58] Field of Search .................................... 430/303, 200, 430/201, 309, 331, 326, 944; 101/467

[56] References Cited

U.S. PATENT DOCUMENTS

| | | | |
|---|---|---|---|
| 4,772,583 | 9/1988 | Sprecker et al. | 512/12 |
| 4,833,124 | 5/1989 | Lum | 503/227 |
| 4,912,083 | 3/1990 | Chapman et al. | 503/227 |
| 4,942,141 | 7/1990 | DeBoer et al. | 503/227 |
| 4,948,776 | 8/1990 | Evans et al. | 503/227 |
| 4,948,777 | 8/1990 | Evans et al. | 503/227 |
| 4,948,778 | 8/1990 | DeBoer | 503/227 |
| 4,950,639 | 8/1990 | DeBoer et al. | 503/227 |
| 4,952,552 | 8/1990 | Chapman et al. | 503/227 |
| 5,023,229 | 6/1991 | Evans et al. | 503/227 |
| 5,252,431 | 10/1993 | Yoshida et al. | 430/303 |
| 5,378,580 | 1/1995 | Leenders | 430/303 |
| 5,721,087 | 2/1998 | Yokoya et al. | 430/200 |

FOREIGN PATENT DOCUMENTS

| | | |
|---|---|---|
| 0321923 | 6/1989 | European Pat. Off. . |
| 42-21879 | 10/1942 | Japan . |
| 50-158405 | 12/1975 | Japan . |
| 56-23150 | 5/1981 | Japan . |
| 3-15553 | 1/1991 | Japan . |
| 5-1934 | 1/1993 | Japan . |
| 7-179052 | 7/1995 | Japan . |

OTHER PUBLICATIONS

"Research Disclosure 19201", (Apr. 1980).

Hiroshi ITO et al, "Applications of Photoinitiators to the Design of Resists for Semiconductor Manufacturing", *Polymers in Electronics,* pp. 11–23, 1984.

E. Reichmanis et al, *Microelectronic Engineering,* 13, (1991) pp. 3–10.

Jean Frechet et al, "New Approach to Imaging Systems Incorporating Chemical Amplification: Synthesis and Preliminary Evaluation of Novel Resists Based on Tertiary Copolycarbonates", *Journal of Imaging Science,* vol. 30, No. 2, Mar./Apr. 1986.

*Primary Examiner*—Janet C. Baxter

*Assistant Examiner*—Jill N. Hackathorn

*Attorney, Agent, or Firm*—Burns, Doane, Swecker & Mathis, LLP

[57] ABSTRACT

The present invention relates to a method of making a waterless lithographic printing plate having an image by which printing can be effected without using dampening water, comprising the steps of (1) providing a waterless lithographic fresh printing plate by layering on a substrate a first layer which converts laser light to heat and a second layer which has an ink-repellent surface, sequentially, (2) exposing the waterless lithographic fresh printing plate laser light by irradiating laser light which can be absorbed by the first layer, and (3) applying a liquid having a surface tension of 25–50 dyn/cm$^2$ to the second layer, and abrading the surface of the second layer to remove the exposed portion of the second layer selectively so that an image enabling printing without using dampening water can be formed.

24 Claims, 3 Drawing Sheets

METHOD OF MAKING A WATERLESS LITHOGRAPHIC PRINTING PLATE

BACKGROUND OF THE INVENTION

1. Field of the Invention

The present invention is directed to a method of making a lithographic printing plate in which printing without dampening water can be effected via a heat-mode recording using laser light.

2. Description of the Related Art

Various conventional printing methods involved in a printing method using a printing plate include typography, photogravure, lithographic offset printing, and the like. In recent years, printing using a lithographic printing plate has come to be increasingly used in fields other than a specialized field of printing. In this lithographic offset printing, are known a lithographic printing plate with the use of dampening water (which is referred to as a water printing plate hereinafter), which forms an image pattern having hydrophilic and hydrophobic characteristics on the surface of the plate, and a waterless lithographic printing plate (which is referred to as a waterless printing plate hereinafter), which forms an image pattern having ink-repellent and ink-acceptable characteristics on the surface of the plate without using dampening water. The characteristics of a waterless printing plate have many advantages over a water printing plate. Namely, because dampening water is not used, printing work does not require particular skill. Because ink density remains stable from the beginning of printing, the amount of spoilage is reduced, thus enabling even a small number of prints to be produced economically and so on.

Due to the ongoing evolution of computer technology, a plate-making step, which is regarded as a pre-printing step which has conventionally been done manually, has become digitized so that printing images are converted to digital data accordingly. At present, a plurality of techniques (i.e., computer-to-plate techniques) in which a plate for printing can be formed directly from digital data without using lithographic film have been developed. In actuality, however, most of the aforementioned techniques are directed toward water printing plates, and very few techniques are provided for making waterless printing plates.

Among this small number of techniques or methods for making a waterless printing plate, Japanese Patent Application Publication (JP-B) No. 42-21879 has the earliest disclosure of such a method or technique in which a waterless printing plate can be formed through laser writing, and discloses that a printing method in which a portion of an ink-repellent silicone layer is removed by laser irradiation and made adherent to ink, thus effecting a waterless printing. However, drawbacks are involved, however, such as the laser-irradiated portion of the silicone layer scattering over the entire surface of the waterless printing plate; drawbacks are caused during printing; and, because portions of the silicone layer cannot be removed sufficiently by laser irradiation alone, image areas onto which ink adheres increase as the number of printings increases (i.e., dot gain occurs).

Japanese Patent Application Laid-Open (JP-A) No. 50-158405 discloses that a fresh printing plate having a silicone rubber surface layer is irradiated using a infrared-light YAG laser, naphtha is applied to the fresh printing plate to effect a developing process so that the laser-irradiated silicone portion is removed, and a waterless printing plate is thereby formed. Further, "Research Disclosure 19201 (published in April 1980)" discloses that a fresh printing plate is formed by a bismuth layer disposed on a polyester film and a silicone layer disposed on the bismuth layer. After an argon laser beam irradiated the aforementioned fresh printing plate, the argon laser-irradiated fresh printing plate is immersed in n-hexane for 30 seconds in order to apply n-hexane as a swelling agent to the silicone rubber layer so as to effect a developing process.

There is a drawback in that the quality of each of the plates formed by the above-described methods is low.

EP-0685333A2 discloses a method of making a waterless printing plate in which, after a YAG laser irradiates a printing plate having a silicone rubber surface layer, the surface of the printing plate is abraded under a non-solvent dry condition to remove the laser-irradiated portion so that a waterless printing plate is formed. According to an example of this disclosure, it has been pointed out that in the case of dry processing, a printed image exhibits a low resolution compared to the case of processing using a liquid therewith. Further, a problem arises in that, because a silicone rubber layer is abraded in a non-solvent state, the surface thereof is apt to be scratched, and ink for printing adherent increasingly the scratched portion, thereby causing scumming or tinting. It is described in an example that when printing is effected by using a plate which is obtained as described above, image areas onto which ink adheres change accordingly as the number of printings increases.

An instance of a two-step developing process is described in Japanese Patent Application Laid-Open (JP-A) No. 7-179052. Namely, after a fresh printing plate has been exposed by YLF laser, the surface of the fresh printing plate is abraded under a dry condition. Thereafter, the fresh printing plate is further abraded by a cotton pad which is dampened with 1% of an aqueous industrial detergent solution. Drawbacks arise with this method in that, as described above, a silicone rubber is easily scratched because of the dry abrasion, causing scumming on a printed image, and it is necessary to effect two-step developing processes.

U. S. Pat. No. 5378580 discloses that, after a printing plate having a silicone rubber surface layer has been irradiated by a YAG laser beam, the laser-irradiated portion is abraded when isopropyl alcohol is being applied to the printing plate to remove a portion to prepare a waterless printing plate. It has been pointed out, however, that as the number of prints increases, image areas onto which ink adheres are changed.

In this way, any one of the conventionally known developing processes involving abrasion has had such problems as those described above.

Since most of the above-described conventional fresh printing plates must immerse the plate which has been irradiated by laser in a processing solution in order to effect a developing process, independent apparatuses (i.e., a laser writing machine, an automatic developing machine, and printer) must be provided respectively in order to effect three steps constituted by laser image recording, a developing process, and printing. Accordingly, manual work necessitating use of the hands has been involved for transferring a printing plate from one to another among the three above-described apparatuses, or the like, so that undesirable problems have been caused in which misregistration or the like has occurred during printing.

Conversely, instead of effecting a developing process by immersing a printing plate in a large amount of liquid, when the developing process can be effected by applying a relatively small amount of liquid and abrading the surface of the printing plate material, a developing processing section can be designed to be more compact, and a reasonable printing system by which laser writing, a developing process, and printing can be implemented by the same apparatus can be realized. More specifically, a plate transfer process is not needed because a laser recording and a developing process can be effected on a printing cylinder of a printing machine so that the time and steps for processing can be reduced. Further, because there causes no problem of misregistration, an extremely reasonable printing process can be implemented.

A method of making a waterless lithographic printing plate is most valuable in practical application when it is effected in an aspect which has been described above. However, in a case in which a plate is abraded in the presence of a relatively small amount of liquid, as long as conventionally disclosed solvents (naphtha, hexane, isopropyl alcohol, and water) are used, it was not possible to obtain a waterless printing plate having excellent quality.

In the present specification, a lithographic fresh printing plate (or a waterless fresh printing plate) means a printing plate material prior to an image recording which is in a state in which an image pattern having an ink-repellent portion and an ink-acceptable portion is not yet formed thereon. On the other hand, a plate (or a waterless printing plate) means a printing plate material having an image pattern having an ink-acceptable portion and an ink-repellent portion formed thereon so that the printing plate material can directly be subjected to printing.

SUMMARY OF THE INVENTION

As described above, several methods of making a waterless printing plate by using a laser have been provided conventionally. However, problems in resolving power, printing performance, and the like have not yet been solved satisfactorily.

Further, a method of effecting a developing process using a small amount of liquid cannot solve the above-described problems, either.

Moreover, it is desired that a reasonable printing system be realized in which laser writing, a developing process, and printing can be effected by the same apparatus.

It is therefore an object of the present invention to provide a method of making a waterless printing plate capable of recording with a laser so that an image having an excellent resolving power and printing performance can be formed.

It is another object of the present invention to provide a method of making a waterless printing plate capable of recording with a laser by abrading a waterless fresh printing plate using only a small amount of liquid so that an image having an excellent resolving power can be formed.

It is yet another object of the present invention to provide a method of making a waterless printing plate which is suitable for a reasonable waterless lithographic system in which laser writing and printing can be effected by the same apparatus.

The present inventors extensively studied a method of making a waterless printing plate in which laser writing can be effected, and have found the above-described objects can be achieved by the following method for making a waterless lithographic printing plate.

Namely, an aspect of the present invention is a method of making a waterless lithographic printing plate having an image by which printing can be effected without using dampening water, comprising the steps of (1) providing a waterless lithographic fresh printing plate by sequentially layering, on a substrate, a first layer which converts laser light to heat and a second layer which has an ink-repellent surface, (2) exposing the waterless lithographic fresh printing plate laser light by irradiating laser light which can be absorbed by the first layer; and (3) applying a liquid having a surface tension of 25–50 dyn/$cm^2$ to the second layer and abrading the surface of the second layer to selectively remove the exposed portion of the second layer so that an image enabling printing without using dampening water can be formed.

In the present invention, a "first layer" refers to a layer which converts the light by which this layer is exposed to heat, and, on the basis of heat, which functions to reduce adhesiveness (holding power) of a second layer with respect to a substrate. Further, in the present specification, "adhesiveness" refers to an indirect adhesiveness between the substrate and the second layer by interposing a layer such as the first layer or the like therebetween.

In the present invention, a "second layer" refers to a layer which has an ink-repellent surface to which ink does not adhere substantially to a waterless lithographic printing plate and which serves as a non-image printing portion.

In a method of making a waterless lithographic printing plate according to the present invention, it is preferable to apply a liquid whose boiling point is 90° C. or higher to the surface of the second layer. It is also preferable that the amount of liquid used be 200 ml/$cm^2$ or less. Further, it is preferable that a waterless lithographic "fresh" plate used in a method of making a waterless lithographic printing plate according to the present invention has a second layer whose main component is made of silicone rubber.

DESCRIPTION OF THE PREFERRED EMBODIMENTS

Figure 1:
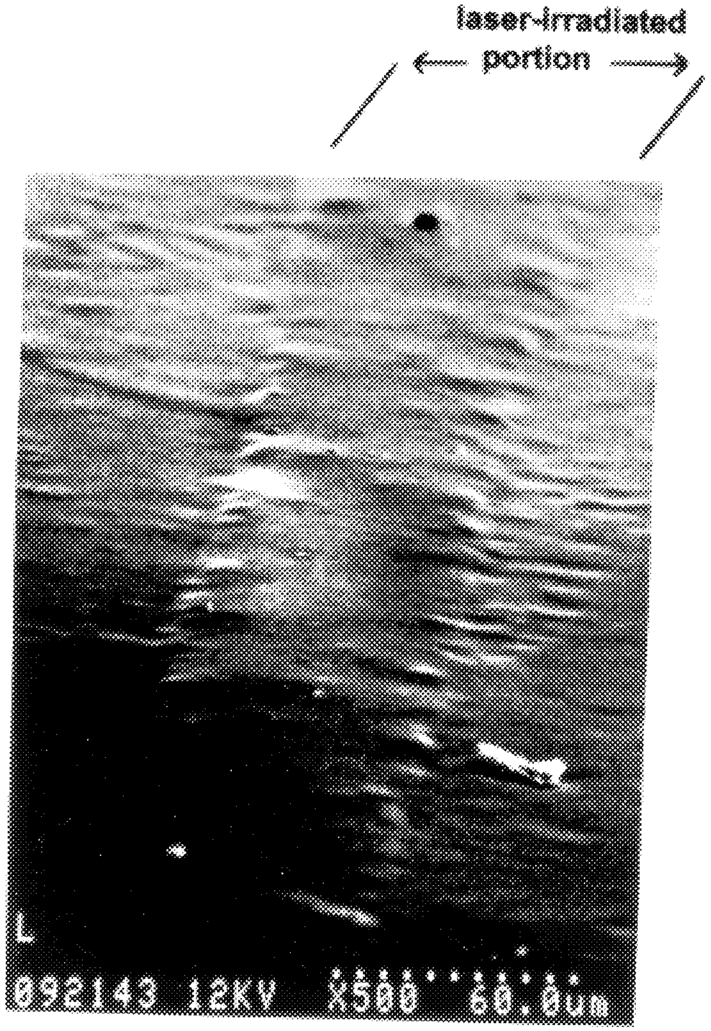
FIG. 1 is an electron microphotograph illustrating the surface of a printing plate after a latent image has been formed thereon by laser irradiation relating to an example of the present invention.

The present invention will be described in detail hereinafter.

First of all, in a method of making a lithographic printing plate without using dampening water (hereinafter referred to as a method of making a waterless printing plate) according to the present invention, a lithographic fresh printing plate without using dampening water (hereinafter referred to as a "waterless fresh printing plate") is provided by sequentially layering, on a substrate, a first layer which converts laser light to heat and a second layer which has an ink-repellent surface.

In this waterless fresh printing plate, the first layer is formed between the substrate and the ink-repellent second layer. An optional layer/layers may be disposed between the first layer and the second layer or between the substrate and the first layer provided that the first layer and the second layer can exhibit their intrinsic characteristics.

If the aforementioned characteristics are provided respectively for the first layer and the second layer, an arbitrary material can be used for them. However, it is generally preferable that the first layer contains an organic pigment or an organic dye and that the second layer is a silicone rubber layer. In this way, although preferable materials for each of the layers exist, in a broad meaning, the present invention does not intend to limit each of the first and second layers to a special type of material. Accordingly, the first and second layers will be explained in more detail hereinafter, including the explanation of a substrate.

When the waterless fresh printing plate is irradiated with laser light, laser light energy is absorbed by the first layer. The temperature of the first layer, which converts light to heat, is raised by laser irradiation (it is preferable that the temperature rise as rapidly as possible). On the basis of the temperature, a chemical reaction or a physical change such as burning, fusion, dissolution, vaporization, explosion (i.e., abrasion), or the like is formed on a portion or the whole portion of the first layer and/or a portion or the whole portion of the second layer. As a result, adhesiveness or integration between layers deteriorates within a region substantially irradiated by laser and any portion between the substrate and the ink-repellent second layer (on an interface or within the layer) so that adhesiveness (holding power) of the second layer to the substrate is reduced. Because such a deterioration of adhesiveness is caused only within the region substantially irradiated by the laser, an external force such as abrasion or the like is applied to the surface of the second layer after laser irradiation so that a material having an ink-repellent surface can be selectively removed.

As the next essential step, a method of making a waterless printing plate according to the present invention implements a step of irradiating laser light which can be absorbed by the first layer to the fresh printing plate to perform an imagewise exposure. Because the aforementioned waterless fresh printing plate is used, when laser light is irradiated to the plate, laser light energy is absorbed by the first layer of the waterless fresh printing plate and is converted to heat energy. Due to this, the adhesiveness (holding power) of the portion substantially irradiated by laser light, which is provided between the substrate and the second layer having the ink-repellent surface, is reduced so that a heat-mode recording is effected. Namely, an image is formed as a latent image by heat on the basis of laser light energy. In many cases, a laser-irradiated portion of the second layer is held on the surface of the waterless fresh printing plate without breakage or scattering even after laser irradiation. Adhesiveness between the second layer and a layer underneath the second layer, however, is greatly reduced so that it becomes facilitated to abrade or remove the laser-irradiated portion of the second layer by applying an external force such as abrasion or the like (see an example of the invention).

Types of laser used for exposing a waterless fresh printing plate are not limited, provided that the laser can provide wavelengths and exposure amounts for the reduction of adhesiveness of the second layer to allow the second layer to be removed in a later process. Further, as will be described later, in accordance with the method of making a waterless printing plate of the present invention, because the second layer can be removed more smoothly, the selection of wavelengths and exposure amounts of the laser to be used becomes more flexible than in a conventional method.

Gas lasers such as Ar laser or carbon dioxide laser, solid lasers such as the YAG laser, and semiconductor lasers can be used. In general, a laser having an output of 100 mW or more is required. From the standpoint of practicality, such as maintenance, cost, and the like, it is preferable to use a semiconductor laser or a semiconductor-excited solid laser (YAG laser or the like).

Because a laser is mainly used to generate heat, it is preferable to use an infrared wavelength region as the recording wavelength, and, ordinarily, oscillation wavelength of 800 nm to 1100 nm can be used.

In the method according to the present invention, the next essential step is effected such that, after laser irradiation, an exposed portion of the second layer can be removed selectively by applying a liquid having a surface tension of 25–50 dyn/cm$^2$ to the ink-repellent surface of the second layer and by abrading the second layer.

A principal characteristic of the present invention is that a liquid with a surface tension of 25–50 dyn/cm$^2$ is used. The adhesiveness of a laser-irradiated portion of the second layer with respect to the substrate is reduced. By using the above-described liquid, however, only the substantially laser-irradiated portion of the second layer is removed easily, rapidly, and selectively by abrasion so that the resolving power of the image printed can be improved.

Typically, surface tension is a physical quantity which is equivalent to work during the time at which surface area is increased by the amount of a unit, and which is equivalent to the Gibbs' energy of a surface per unit surface area. Surface tension is strictly determined by its measurement at the interface between a liquid and its vapor where they come in contact with each other. Generally, however, the aforementioned measurement is effected at the interface between a liquid and air containing a vapor of the liquid. In accordance with the present invention, the value measured at an interface between the liquid and air is adopted as the surface tension. Although a surface tension changes due to temperature, in the present invention, the surface tension at a temperature of 25° C. is shown.

Liquid having a surface tension of 25–50 dyn/cm$^2$ at a temperature of 25° C. is illustrated below:

Various types of liquid comprise: methoxyethanol (31.8 dyn/cm$^2$), 2-ethoxyethanol (28.2 dyn/cm$^2$), 2-butoxyethanol (27.4 dyn/cm$^2$), 2-phenoxyethanol (45.6 dyn/cm$^2$); glycols such as diethyleneglycol (47 dyn/cm$^2$), diethyleneglycol monomethyl ether (34.8 dyn/cm$^2$), diethyleneglycol monoethyl ether (31.8 dyn/cm$^2$), diethyleneglycol monobutyl ether (33.6 dyn/cm$^2$), triethylene glycol (48 dyn/cm$^2$), 1-methoxy-2-propanol (27.1 dyn/cm$^2$), 1-ethoxy-2-propanol (25.9 dyn/cm$^2$), ethylene glycol (45.5 dyn/cm$^2$), and the like; high-boiling-point alcohols such as 1, 3-butanediol (37.8 dyn/cm$^2$), cyclohexanol (34 dyn/cm$^2$), 2-methyl cyclohexanol (20.4 dyn/cm$^2$), furfuryl alcohol (38 dyn/cm$^2$), tetrahydrofurfuryl alcohol (37 dyn/cm$^2$), 2-methyl-2, 4-pentanediol (27 dyn/cm$^2$), 1, 5-pentanediol (43.2 dyn/cm$^2$), 1, 4-butanediol (45.2 dyn/cm$^2$), and the like; high-boiling-point ethers such as dioxane (36 dyn/cm$^2$), diethyleneglycol dimethylether (29.5 dyn/ cm$^2$), and the like; ketones such as 2-hexanone (25.3 dyn/cm$^2$), methylisobutyl ketone (25.4 dyn/cm$^2$), cyclohexanone (34.5 dyn/cm$^2$), diacetone alcohol (31.0 dyn/cm$^2$), and the like; esters such as isopentylpropionate (26.6 dyn/cm$^2$), diethyl oxalate (32 dyn/cm$^2$), diethyl malonate (32 dyn/cm$^2$), 2-ethoxyethyl acetate (31.8 dyn/cm$^2$), 2-methoxyethyl acetate (31.8 dyn/cm$^2$), diethylene glycol monoethylether acetate (31.0 dyn/cm$^2$), and the like can be used.

Even in the case that one of the aforementioned liquids was mixed with another liquid, provided that the mixed liquid has a surface tension of 25–50 dyn/cm$^2$, the mixed liquid can be used.

Because a liquid having a surface tension of 25–50 dyn/cm$^2$ exhibits excellent developing performance, a waterless printing plate making method according to the present invention is particularly advantageously practiced at a time when a developing process is effected such that a relatively small amount of liquid as a developer is applied to a waterless printing plate and abrades the waterless printing plate. If the boiling point of the liquid is low, however, during a developing process by abrasion, the liquid evaporates and is lessened so that it becomes no longer possible to effect a desirable developing process. Accordingly, it is desirable to use a liquid having a boiling point of 90° C. or higher. From the viewpoint of an environmental protection, it is also preferable to use a liquid having a higher boiling point. In accordance with the above-described preferred embodiment of the present invention, it is possible to prevent conventionally used liquids such as hexane, isopropyl alcohol, and the like from causing environmentally adverse effects and causing drawbacks in printing performance.

At present, it has not yet been proved that why a liquid having a surface tension of 25–50 dyn/$cm^2$has shown excellent developing performance, but the reasons below can be considered.

If a liquid has a large surface energy exceeding more than 50 dyn/$cm^2$, the liquid does not have sufficient affinity for the ink-repellent surface of a layer and is easily repelled by the surface. Therefore, it is assumed that it is difficult to exert the effects by using a liquid apparently shown. Especially when a developing process is effected by using a small amount of liquid, the effects which are supposed to be obtained by using liquid do not occur because the surface of a printing plate material is not entirely covered with the liquid, so that scratches may be formed on the surface of the plate.

On the other hand, if a liquid has a small surface energy which is less than 25 dyn/$cm^2$, it shows suitable affinity for the ink-repellent surface of a layer. Because of the existence of a liquid, however, the mechanical strength of the layer itself having an ink-repellent surface decreases, durability against abrasion due to a liquid decreases, and when an external force acts upon the ink-repellent surface, stretching characteristics of the layer change so that ink easily adheres and remains at the edge portion of an image. As a result, development characteristics deteriorate.

It is preferable that, when a liquid is used as a developer, the value of the surface tension thereof is 27–40 dyn/$cm^2$.

It is also preferable that, when a liquid is applied to the surface of the second layer, quantity of the liquid is less than or equal to 200 ml/$m^2$, because the quantity is extremely effective for a rational system which can implement laser writing and printing using a single apparatus.

Further, it is preferable to use the above-described glycols, diols, and esterified chemicals thereof.

A method of abrading a waterless fresh printing plate is effected so that an external force is applied to the second layer due to a point contact or a surface contact using a brush, a pad, a stick, or the like.

As described above, a waterless fresh printing plate which is suitably used as a method of the present invention will be explained in more detail hereinafter.

Substrate

As a substrate in the aforementioned waterless fresh printing plate according to the present invention, all of the known materials such as metal, plastic film, paper, and all composites thereof which are ordinarily used for offset printing can be used. Each of these materials must, however, conform to physical performance requirements such as mechanical strength, stretching resistance characteristics, or the like, under the conditions required for printing. For example, a metal substrate such as aluminum, a plastic substrate such as polyethylene terephtalate, polyethylene naphtalate, polycarbonate, or the like, and plain paper or a composite sheet formed by laminating a plastic film such as polyethylene, polypropylene, or the like to plain paper are used.

The layer thickness of the substrate is 25 μm to 3 mm, and preferably 75 to 500 μm. However, because the optimal layer thickness changes depending upon the type of the substrate to be used and printing conditions, an ordinary layer thickness is most preferably 100 to 300 μm.

Various surface treatments and coatings can be effected on these substrates in order to increase adhesiveness between a substrate and the layer adjacent to the substrate such as a first layer formed on the substrate. These surface treatments and surface coatings includes known treatments including corona discharge treatment, coating with various coupling agents, coating with gelatin and other adhesive resins, and the like.

First layer

As a first layer of the waterless fresh printing plate, known light-to-heat conversion materials having a function of converting laser light to heat (light-to-heat conversion) can be used.

If laser light is from an infrared laser, it is known that various organic and inorganic materials such as infrared-light-absorbing dyes, infrared-light-absorbing pigments, infrared-light-absorbing metals, infrared-light-absorbing metal oxides, and the like for absorbing light having wavelength used for writing laser can be used for the light-to-heat conversion material. In addition to these materials, materials can be used in which light-to-heat conversion can be effected by arbitrary laser light.

Further, these materials are used in the form of a single film or in the form of a mixed film with other components such as a binder, an additive agent, and the like. The single film is formed by depositing a metal such as aluminum or a metal oxide, an organic dye, or the like on a substrate. The mixed film is formed by applying a light-to-heat conversion material which has been dissolved or dispersed together with other components on the substrate.

Light-to-heat conversion material

Light-to-heat conversion materials include various carbon blacks such as acidic carbon blacks, basic carbon blacks, neutral carbon blacks, and the like; various carbon blacks whose surfaces are modified or coated in order to improve their dispersibility; and nigrosines; organic dyes such as compounds disclosed in “Infrared Sensitizing Dyes” (Matsuoka, Plenum Press, New York, N.Y. (1990)), U.S. Pat. No. 4,833,124, European Patent Application No. 321923A, U.S. Pat. No. 4,772,583, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,912,083, U.S. Pat. No. 4,952,552, U.S. Pat. No. 5,023,229, and the like; and metals or metal oxides such as aluminum, indium tin oxide, tungsten oxide, manganese oxide, titanium oxide, and the like. In addition, conductive polymers such as polypyrrole, polyaniline, and the like are also used.

Binder

A binder is used in the case in which a first layer is formed as a mixed film. Known binders which dissolve or disperse a light-to-heat conversion material can be used. For example, celluloses such as nitrocellulose, ethylcellulose, and the like; cellulose derivatives; acrylic esters such as polymethylmethacrylate, polybutylmethacrylate, and the like; homopolymers and copolymers of methacrylate;

homopolymers or copolymers of styrene monomers such as polystyrene, α-methylstyrene, and the like; various synthetic rubbers such as isoprene, styrene-butadiene, and the like; homopolymers of vinyl esters such as polyvinyl acetate, and the like and copolymers of vinyl acetate-vinyl chloride, and the like; various condensed polymers such as polyurea, polyurethane, polyester, polycarbonate, and the like; and binder and the like used for "Chemically Amplified Binder Systems" as disclosed in J. Imaging Sci., 30 (2) P. 59–64 (1986) (Frechet et al.), "Polymers in Electronics" (Symposium Series, P. 11, 242, T. Davidson, Ed., ACS Washington, DC (1984) (Ito, Willson), and "Microelectronic Engineering", P. 3–10,13 (1991) (E. Reichmanis, L. F. Thompson).

Additives

In the case in which a first layer is formed as a mixed layer, additives can be used in addition to a light-to-heat conversion material and a binder. Additives are added in accordance with various purposes to improve the mechanical strength of the first layer, to improve the sensitivity in laser recording, to improve the dispersibility of a dispersed material in the first layer, and to increase the adhesiveness of a substrate and a second layer, which are disposed adjacent to the first layer, with respect to the first layer.

For example, in order to improve the mechanical strength of the first layer, means for cross-linking the first layer can be thought of, and various cross-linking agents added thereto.

In order to improve the sensitivity in laser recording, a known compound which decomposes and generates a gas by heating may be added. In this case, the sensitivity in laser recording can be increased due to a rapid expansion of the volume of the first layer. (Additives such as azidodicarbonamide, sulfonylhydrazine, dinitrothopentametylenetetramine, and the like can be used.)

Further, a known compound which decomposes to generate an acid compound by heating can be used as an additive. The additive thus obtained is used together with a binder in a chemical amplification system so that the decomposition temperature of the component materials of the first layer is greatly decreased. As a result, sensitivity in laser recording can be improved. In this case, additives such as iodonium salts, sulfonium salts, phosphonium citrate, oximesulfonate, dicarbodiimidosulfonate, triazine, and the like can be used.

In a case in which a pigment such as carbon black or the like is used as a light-to-heat conversion material, the dispersibility of the pigment may affect the sensitivity in laser recording. Further, in order to effect a stable coating on the second layer, the dispersibility of a pigment must often be increased so that various pigment dispersants can be used as additives.

In addition to the above-described additives, various additives such as surfactants can be used in order to improve coating characteristics.

Layer thickness

Relating to a layer thickness of the first layer, in the case of a layer without other components can be formed using a vapor deposition. In this case, the layer thickness is preferably 50 to 1000 Å and more preferably 80 to 500 Å. The first layer as a mixed layer is formed by coating. In this case, a thickness of 0.05 to 10 μm is preferable and 0.1 to 5 μm is more preferable. When the first layer is too thick, an undesirable result is that the sensitivity is reduced in laser recording, or the like.

Second layer

As a second layer in the above-described waterless fresh printing plate, a material having a known ink-repellent surface can be used.

Fluorine compounds or silicone compounds having a low surface energy are well known as materials having an ink-repellent surface. A silicone rubber (i.e., silicone elastomer) is especially suitable for use as an ink-repellent layer of a waterless lithographic printing plate.

Silicone rubbers are classified into three types of rubber: (1) a condensation-type silicone rubber, (2) an addition-type silicone rubber, and (3) a radiation-curable-type silicone rubber. However, for a silicone rubber for the second layer of a waterless printing plate according to the present invention, all of these known silicone rubbers can be used.

A condensation-type silicone rubber is a silicone rubber produced by a condensation reaction. Usually, polydimethylsiloxane having a terminal silanol group (—Si—OH) is used as a base polymer. The condensation reaction of the base polymer with a condensing cross-linking agent represented by the general formula below is effected in the presence of a known catalyst such as an organic tin compound, an organic titanium compound, or the like so that condensation-type silicone rubber is formed.

General formula

Rm·Si·Xn (m+n=4; n is an integer of 2 or greater)

wherein, R represents an alkyl group having 1 to 10 carbon atoms or an aryl group having 6 to 20 carbon atoms, and R may have a substituent. X represents a halogen atom such as Cl, Br, or the like, a hydrogen atom, a hydroxyl group, an organic group such as —OCOR', —$OR^2$,

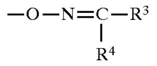

or the like. $R^1$ represents an alkyl group having 1 to 10 carbon atoms or an aryl group having 6 to 20 carbon atoms, and may have a substituent group. $R^2$, $R^3$, and $R^4$ each represent an alkyl group having 1 to 10 carbon atoms, respectively.

An addition-type silicone rubber is a silicone rubber produced by an addition reaction of a Si—H group with a double-bond group by a hydrosilylation reaction. Usually, polydimethylsiloxane having a terminal end substituted with a vinyl group is used as a base polymer. The hydrosilylated reaction of the base polymer with a cross-linking agent having a plurality of Si—H groups for silicone compounds is effected in the presence of a known platinum catalyst, so that an addition-type silicone rubber is formed.

A radiation-cured type silicone rubber is synthesized by a cross-linking reaction by the radiation of a silicone base polymer having a functional group which can be polymerized by irradiation. Generally, a base polymer having an acrylic functional group is used and cross-linked by the irradiation of UV rays so that the radiation-cured type silicone rubber is formed.

A detailed description of the aforementioned silicone rubber is given in "Latest Silicone Application Technology R&D Report No. 22" (CMC, 1982), Japanese Patent Application Publication (JP-B) No. 56-23150, Japanese Patent Application Laid-Open (JP-A) No. 3-15553, and Japanese Patent Application Publication (JP-B) No. 5-1934.

The aforementioned silicone rubbers are coated directly on the first layer or via another layer interposed between the silicone rubber and the first layer. In the case of a condensation-type silicone rubber or an addition-type silicone rubber, a solution in which a base polymer, a cross-linking agent, and a catalyst are dissolved is coated as a coating liquid, and a cross-linking reaction takes place by heating the coated layer so that a silicone rubber layer is formed. In the case of a radiation-curable-type silicone rubber, a solution in which a base polymer is dissolved with an initiator is coated as a coating liquid, and after coating, the entire surface of the layer is exposed to radiation so that the radiation-cured type silicone rubber is formed.

The layer thickness of these silicone rubbers is 0.3 to 20 $\mu$m, preferably 0.5 to 10 $\mu$m, and more preferably 0.7 to 5 $\mu$m.

In order to increase adhesiveness between the second layer and its adjacent layer, it is possible to add a known adhesiveness promotor to a coating liquid for the second layer. Alternatively, a surface treatment for promoting the adhesiveness of the adjacent layer to the silicone compounds is applied beforehand to the adjacent layer. It is known that titanium coupling agents such as polytetrabutyl titanate, polytetraisopropyl titanate, and the like are used for exhibiting the above-described effects.

Other additional layers

For various purposes, another additional layer can be disposed between a substrate and a first layer. For example, in order to increase ink acceptability where the silicone compound is removed through laser exposure, it is possible to provide an ink-acceptable layer. A known ink-acceptable organic coating is available for the ink-acceptable layer. Various polymer coatings such as acrylic, methacrylic, styrene, vinylester, polyester, polyurethane polymers, and the like can be used. Especially when the first layer is formed directly on an ink-unacceptable material such as a metal substrate, the above-described ink-acceptable layer is useful.

Further, in order to reduce the pressure acting upon a silicone layer during printing, it is also possible to provide a coating as a cushion layer between the substrate and the first layer. The coating also works effectively when the substrate is a metal substrate which is not provided with capability of reducing the pressure acting upon a silicone layer during printing. Excellent function is also exhibited sufficiently by the above-described organic coating for achieving this purpose.

EXAMPLES

The present invention will be described in more detail hereinafter by using examples. The present invention is not limited, however, to the examples that follow.

Example 1

Making of a waterless fresh printing plate

Substrate

A gelatin undercoat layer was formed as an adhesive layer on a polyethyrene terephtalate film having a thickness of 175 $\mu$m. The dry layer thickness of the gelatin undercoat layer was 0.2 $\mu$m.

Preparation of a carbon black dispersion

After a mixture of the composition below was dispersed by a paint shaker for 30 minutes, glass beads were filtered so that a carbon black dispersion was prepared.

TABLE 1

| | |
|---|---|
| carbon black # 40 (Mitsubishi Carbon Co., Ltd.) | 5.0 g |
| polyurethane Nipporan 2304 (Nihon Polyurethane KK) | 5.0 g |
| Solsperse S20000 (ICI Co., Ltd.) | 0.27 g |
| Solsperse S12000 (ICI Co., Ltd.) | 0.22 g |
| tetrahydrofuran | 45 g |
| glass beads | 160 g |

Forming of a first layer

A coating liquid having the composition below was applied to the aforementioned gelatin undercoat polyethyrene terephtalate film to form a first layer having a dry layer thickness of 2 $\mu$m.

TABLE 2

| | |
|---|---|
| above-described carbon black dispersion | 55 g |
| nitrocellulose (containing 30% of n-propanol) | 7.2 g |
| tetrahydrofuran | 45 g |

(Forming of a second layer)

A coating liquid having the composition below was applied to the first layer, heated (at a temperature of 110° C. for 2 minutes), and then dried so that a second layer comprising an addition-type silicone rubber and having a dry layer thickness of 2 $\mu$m was formed. As a result, a waterless fresh printing plate for laser recording was formed.

TABLE 3

| | |
|---|---|
| α, ω - divinylpolydimethylsiloxane (degree of polymerization: approximately 700) | 9.00 g |
| $(CH_3)_3$-Si-O-$(SiH(CH_3)$-$O)_8$-Si-$Si(CH_3)_3$ | 0.50 g |
| polydimethylsiloxane (degree of polymerization: approximately 8,000) | 0.50 g |
| olefin-chloroplatinic acid | 0.04 g |
| inhibitor [HC≡C—$C(CH_3)_2$-O—$Si(CH_3)_3$] | 0.07 g |
| heptane | 55 g |

Making of a waterless printing plate

Continuous lines were written to the waterless fresh printing plate by a semiconductor-excited YAG laser having a wavelength of 1,064 nm and a beam diameter of 100 $\mu$m (1/e2). The recording energy was 0.75 J/cm$^2$. An electron microphotograph of the surface of the plate on which a latent image was recorded is shown in FIG. 1. With the amount of the aforementioned recording energy, the silicone layer cannot be removed sufficiently from the surface of the plate by laser recording alone. It can be seen that the silicone portion of the second layer is partially separated from the first layer due to chemical and/ or physical changes of the first layer, but still remains on the surface of the waterless fresh printing plate.

Figure 2:
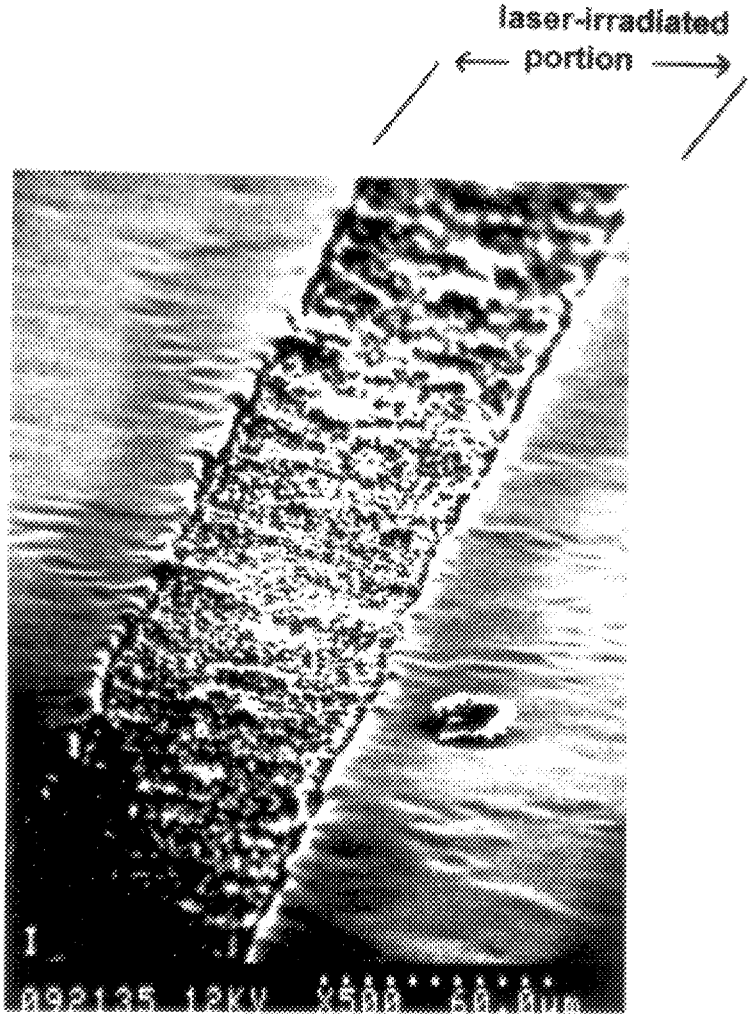
FIG. 2 is an electron microphotograph illustrating the surface of a printing plate having an image formed on a waterless original printing plate relating to an example of the present invention.
Figure 3:
FIG. 3 is an electron microphotograph illustrating the surface of a printing plate after a latent image has been formed thereon by laser irradiation relating to a comparative example of the present invention.

However, 100 ml/cm$^2$ of 2-ethoxyethanole as a liquid (having a surface tension of 28.2 dyn/cm$^2$ and a boiling point of 135° C.) was applied to the above-described surface of the waterless fresh printing plate and the surface of the second layer was abraded by a cotton pad so that laser-irradiated portions of the silicone layer of the second layer were easily removed from the surface of the waterless fresh printing plate. On the other hand, portions of the silicone layer which were not irradiated by the laser were not removed and were held on the surface of the waterless fresh printing plate. As a result, as shown in FIG. 2, an image with silicone having a sharp edge was formed.

Further, when writing was effected on the surface of a waterless fresh printing plate at a main scanning speed of 6 m/s using a semiconductor laser having a power of 110 mW, a wavelength of 825 nm, and a beam diameter of 10 $\mu$m (1/e2), in the same manner as the above-described YAG laser recording, the laser-irradiated portion of the silicone layer was partially separated from the first layer but remained on the surface of the fresh printing plate. The same manner and liquid were used as the above-described laser recording, and the silicone was removed so that a waterless printing plate was formed. As a result, a waterless printing plate having a sharp edge portion was formed such that the sensitivity of the laser recording was 300 mJ/ cm, and the resolving power was 6 $\mu$m. Under this recording condition, when a dot formation of 200 lines was effected on the waterless printing plate, a dot percentage of 1% to 99% was formed on the plate. When 20,000 prints were made by using the waterless printing plate thus formed by a printing machine, the prints having excellent image quality free of scumming or tinting were obtained.

Comparative example 1

A waterless printing plate was formed in accordance with a method disclosed in Example 3 of Japanese Patent Application Publication (JP-B) No. 42-21879 as described hereinafter.

A coating liquid having the composition below was applied to a polyethyrene terephtalate film to form a layer having a dry layer thickness of 5 $\mu$m.

TABLE 4

| | |
|---|---|
| linear polyester resin | 10 g |
| nitrocellulose | 10 g |
| carbon black | 10 g |
| etliylacetate | 40 g |
| methylisobutylketone | 40 g |

Next, a coating liquid having the composition below was applied to the above-described layer so that the resultant layer has a dry coating of 1 g/m$^2$.

TABLE 5

| | |
|---|---|
| Silotex 30 (nonvolatile concentration: 30%) | 10 g |
| glacial acetic acid | 0.03 g |
| Catalyst for Silotex 30 | 0.5 g |
| xylene | 20 g |

The resultant coating layer was heated at a temperature of 150° C. for 10 minutes and was thereby cured.

In almost the same manner as Example 1, when laser writing was effected by a semiconductor-excited YAG laser except that the power of the writing laser was 2.4 J/cm$^2$, the laser-irradiated portions of the silicone layer were broken and partially removed from the plate, but the other portions thereof were not removed especially at the edge portions of images, and remained on the surface of the plate. This state is shown in FIG. 2.

In this way, it is possible to break a silicone layer by laser irradiation alone. However, the energy needed for laser recording increases, and edge portions of the images formed on the waterless printing plate thus formed was not sharp. Accordingly, when a waterless printing plate having such an image as described above was printed, various inconveniences were found such as when the frequency of printings increases, silicone is stripped from the waterless printing plate at the edge portion thereof so that the image printing area is thereby made larger.

Further, when a laser recording was effected successively for a number of printing plate materials, components generated by the printing plate material being broken disperse in the air so that recording portions such as optical systems or the like are contaminated. Therefore, the laser power deteriorates, and a phenomenon occurs such that writing having an excellent reproducibility cannot be implemented. As a result, the recording system was deficient in stability.

Comparative example 2

After writing has been effected by the semiconductor-excited YAG laser, in almost the same manner as Example 1, except that instead of using the liquid, 2-ethoxyethanole which was used in Example 1, hexane (having a surface tension of 17.9 dyn/cm$^2$ and a boiling point of 68.7° C.) was used, the surface of the second layer was abraded by a cotton pad and the laser-irradiated portions of the silicone layer which is the second layer were removed from a waterless fresh printing plate. On the other hand, the portion of the silicone layer which was not irradiated by the laser was not removed from the surface of the waterless fresh printing plate so as to be held on the surface of the waterless fresh printing plate. However, a portion of the exposed silicone portion was not removed completely from the processing system so that portion remained on the surface of the waterless fresh printing plate as foreign matter (silicone foreign matter). Accordingly, ink was not deposited at a portion where it should have been deposited, so the printed image was deficient in printing quality. Further, a portion of the surface of the silicone rubber on the plate was scratched. During printing, ink was deposited at the printed scratched portion, causing print scumming.

Comparative example 3

After writing has been effected by the semiconductor-excited YAG laser, in almost the same manner as Example 1, except that naphtha (having a surface tension of 23.9 dyn/cm$^2$) was used instead of the liquid, 2-ethoxyethanole used in Example 1, the surface of the second layer was abraded by a cotton pad and the laser-irradiated portions of the silicone layer which is the second layer were removed from a waterless fresh printing plate. On the other hand, the portion of the silicone layer which was not irradiated by the laser was not removed from the surface of the waterless fresh printing plate but held on the surface of the waterless fresh printing plate. However, a portion of the exposed silicone portion was not removed completely from the processing system so that the portion remained on the surface of the waterless fresh printing plate as silicone scum. Accordingly, ink was not deposited at a portion where it should have been deposited, so the printed image was deficient in printing quality. Further, a portion of the surface of the silicone rubber on the plate was scratched. During printing, ink was deposited at the scratched portion, causing print scumming.

Comparative example 4

After writing has been effected by the semiconductor-excited YAG laser, in almost the same manner as Example 1, except that isopropyl alcohol (having a surface tension of 21.7 dyn/cm$^2$ and a boiling point of 82° C.) was used instead of the liquid, 2-ethoxyethanole used in Example 1, the surface of the second layer was abraded by a cotton pad and the laser-irradiated portions of the silicone layer which is the second layer were removed from the waterless fresh printing plate. On the other hand, the portion of the silicone layer which was not irradiated by the laser was not removed from the surface of the waterless fresh printing plate but held on the surface of the waterless fresh printing plate. However, a portion of the exposed silicone portions was not removed completely from the processing system so that portion remained on the surface of the waterless fresh printing plate as silicone scum. Accordingly, ink was not deposited at a portion where it should have been deposited, so that the printed image was deficient in printing quality.

Comparative example 5

After writing has been effected by the semiconductor-excited YAG laser, in the same manner as Example 1, except that water (having a surface tension of 72.6 dyn/$cm^2$ and a boiling point of 100° C.) was used instead of the liquid, 2-ethoxyethanole which used in Example 1, the surface of the second layer was abraded by a cotton pad and the laser-irradiated portions of the silicone layer which is the second layer were removed from the waterless fresh printing plate. However, a strong force was needed for the abrasion so that a portion of the surface of the second layer was scratched. When the force of abrasion was weakened, a portion was caused where silicone was not removed.

Example 2

A hydrophobic layer composed of polyurethane having a thickness of 3 μm was applied to an aluminum substrate having a thickness of 0.24 mm and was dried.

Forming of a first layer

After the mixture below was dispersed by a paint shaker for 30 minutes, glass beads were filtered so that a coating liquid for a first layer was prepared. The coating liquid was applied to the above polyurethane-coated aluminum substrate to form a first layer having a dry layer thickness of 2 μm.

TABLE 6

| | |
|---|---|
| carbon black # 40 (Mitsubishi Carbon Co., Ltd.) | 5.0 g |
| nigrosine | 2.0 g |
| polyurethane Nipporan 2304 (Nihon Polyurethane KK) | 5.0 g |
| Solsperse S20000 (ICI Co., Ltd.) | 0.27 g |
| Solsperse S12000 (ICI Co., Ltd.) | 0.22 g |
| nitrocellulose (containing 30% of n-propanol) | 7.2 g |
| tetrahydrofuran | 100 g |
| glass beads | 160 g |

Forming of a second layer

A coating liquid having the composition below was applied to the first layer, heated at a temperature of 110° C. for 20 minutes), and then dried so that a second layer comprising a condensation-type silicone rubber and having a dry layer thickness of 2 μm was formed. As a result, a waterless fresh printing plate for laser recording was prepared.

TABLE 7

| | |
|---|---|
| dimethylpolysiloxane having hydroxyl group at both terminals (degree of polymerization: 700) | 9.00 g |
| methyltriacetoxysilane | 0.63 g |
| dibutyl tin dioctonate | 0.02 g |
| heptane | 53.9 g |

Making of a waterless printing plate

When writing was effected on the surface of the resultant waterless fresh printing plate at the main scanning speed of 6 m/s using a semiconductor laser having a power of 110 mW, a wavelength of 825 nm, and a beam diameter of 10 μm (1/e2), although the laser-irradiated portion of the silicone layer was separated from the first layer in the same manner as Example 1, a portion still remained on the plate. Instead of using 2-ethoxyethanole, i.e., the liquid used in Example 1, 150 ml/$m^2$ of dipropyreneglycol (having a surface tension of 32 dyn/$cm^2$) was applied to the surface of the second layer. The surface of the second layer was abraded by a nylon brush and the irradiated silicone portion of the second layer was removed from the waterless fresh printing plate. As a result, a waterless printing plate was formed. In the same manner as Example 1, the waterless printing plate thus formed was printed and had a sharp image edge portion and a resolving power of 6 μm. Under this recording condition, when a dot formation of 200 lines was effected, a dot percentage of 1% to 99% was formed on the plate. When the waterless printing plate thus formed was printed, 50,000 prints were made by using the waterless printing plate thus formed by a printing machine, prints having excellent image quality and free of tinting or scumming were obtained.

Example 3

A gelatin undercoat layer was formed as an adhesive layer on a polyethylene terephtalate film having a thickness of 175 μm so that a layer having a dry layer thickness of 0.2 μm was formed.

Forming of a first layer

Aluminum was deposited on the above-described substrate by a deposit to form a first layer having a thickness of 200 Å.

Forming of a second layer

In the same manner as Example 2, a second layer composed of a condensation-type silicone rubber and having a layer thickness of 2 μm was formed on the first layer. As a result, a waterless fresh printing plate for laser recording was prepared.

Making of a waterless printing plate

When writing was effected on the surface of the resultant waterless fresh printing plate at the main scanning speed of 4 m/sby a semiconductor laser having a power of 110 mW, a wavelength of 825 nm, and a beam diameter of 10 μm (1/e2), the laser-irradiated portion of the silicone layer remained on the plate. The adhesiveness between the substrate and the silicone layer was reduced, however. Instead of using 2-ethoxyethanole, i.e., the liquid used in Example 1, 80 ml/$m^2$ of dioxane (having a surface tension of 36 dyn/$cm^2$) was applied to the surface of the second layer. The surface of the second layer was abraded by a nylon brush and the irradiated silicone portion of the second layer was removed from the waterless fresh printing plate. As a result, a waterless printing plate was formed. The resultant waterless printing plate had a high resolution of 7 μm. Under this recording condition, when a dot formation of 200 lines was effected, a dot percentage of 1% to 99% was formed on the plate.

Example 4

In the same manner as Example 1, after writing was effected on the waterless fresh printing plate prepared in Example 1 by using a semiconductor laser, instead of using 2-ethoxyethanole, i.e., the liquid used in Example 1, a mixture having a surface tension of 27.0 dyn/$cm^2$ of isopropyl alcohol (surface tension: 21.7 dyn/$cm^2$) and 1,4-buthandiole (surface tension: 45.2 dyn/$cm^2$) was used, and the surface of the second layer was abraded by a nylon brush so that the laser-irradiated portions of the silicone layer which was the second layer were removed from the waterless fresh printing plate. On the other hand, portions of the silicone layer which were not irradiated by laser were removed and held on the surface of the waterless fresh printing plate. As a result, in the same manner as Example 1, a waterless printing plate was formed. A waterless printing plate having a sharp image edge and a high resolving power of 6 μm was formed. Further, when a dot formation of 200 lines was effected, a dot percentage of 1% to 99% was formed on the plate. 50,000 prints having excellent image quality and free of tinting or scumming were obtained by using the waterless printing plate thus obtained.

As described above, in accordance with the present invention, a method for making a waterless printing plate capable of being laser-exposed, having an excellent resolving power and printing performance can be achieved. Further, with this method, it is also possible to achieve an excellent developing performance even under a condition in which a small amount of liquid is used for the developing process.

Further, because only a small amount of liquid is used for the removal of the silicone layer, an abrading member can be installed so as to be compact on a plate cylinder of a printing machine. As a result, it is possible to effect laser recording of a fresh printing plate installed on a plate cylinder of a printing machine on a printing cylinder. It is also possible to realize a reasonable waterless lithographic printing system which can effect the developing process on a printing cylinder.

What is claimed is:

1. A method of making a waterless lithographic printing plate having an image by which printing can be effected without using dampening water, comprising the steps of:

(1) providing a waterless lithographic fresh printing plate by sequentially layering, on a substrate, a first layer which converts laser light to heat and a second layer which has an ink-repellent surface;

(2) exposing the waterless lithographic fresh printing plate laser light by irradiating laser light which can be absorbed by the first layer; and (3) applying a liquid having a surface tension of 25–50 dyn/$cm^2$ to the second layer and abrading the surface of the second layer to selectively remove the exposed portion of the second layer so that an image enabling printing without using dampening water can be formed.

2. A method of making a waterless lithographic printing plate according to claim 1, wherein said first layer which converts laser light to heat includes at least one light-to-heat conversion material selected from the group consisting of organic pigments; organic dyes; metals or metal oxides; and conductive polymers.

3. A method of making a waterless lithographic printing plate according to claim 2, wherein the laser light having a wavelength region of from about 800 nm to about 1,100 nm is emitted from a light source selected from the group consisting of a gas laser, a solid laser, a semiconductor laser, and a semiconductor-excited solid laser.

4. A method of making a waterless lithographic printing plate according to claim 2, wherein said first layer contains at least one compound selected from the group consisting of iodonium salts, sulfonium salts, phosphonium citrate, oxysulfonates, dicarbodiimidosulfonates, and triazines.

5. A method of making a waterless lithographic printing plate according to claim 2, wherein said first layer contains at least one compound selected from the group consisting of azidodicarbonamide, sulfonyl hydrazine, and dinitropentamethylenetetramine.

6. A method making a waterless lithographic printing plate according to claim 2, wherein said organic pigment is selected from the group consisting of acidic carbon black, basic carbon black, neutral carbon black, carbon black whose surface is modified or coated, and nigrosine.

7. A method making a waterless lithographic printing plate according to claim 2, wherein said organic dye is an infrared sensitizing dye.

8. A method making a waterless lithographic printing plate according to claim 2, wherein said metal or metal oxide is selected from the group consisting of aluminum, indium tin oxide, tungsten oxide, manganese oxide, and titanium oxide.

9. A method making a waterless lithographic printing plate according to claim 2, wherein said conductive polymer is selected from the group consisting of polypyrroles and polyanilines.

10. A method of making a waterless lithographic printing plate according to claim 2, wherein said second layer having an ink-repellent surface includes at least silicone rubber selected from the group consisting of a condensation silicone rubber, an addition-type silicone rubber, and a radiation-cured silicone rubber.

11. A method of making a waterless lithographic printing plate according to claim 10, wherein said first layer contains at least one compound selected from the group consisting of azidodicarbonamide, sulfonyl hydrazine, and dinitropentamethylenetetramine.

12. A method of making a waterless lithographic printing plate according to claim 10, wherein the liquid having a surface tension of 25–50 dyn/$cm^2$ is at least one liquid selected from the group consisting of glycols, high-boiling-point alcohols, high-boiling-point ethers, ketones, and esters.

13. A method of making a waterless lithographic printing plate according to claim 10, wherein said first layer contains at least one compound selected from the group consisting of iodonium salts, sulfonium salts, phosphonium citrate, oxysulfonates, dicarbodiimidosulfonates, and triazines.

14. A method of making a waterless lithographic printing plate according to claim 10, wherein the laser light having a wavelength region of from 800 nm to 1100 nm is emitted from a light source selected from the group consisting of a gas laser, a solid laser, a semiconductor laser, and a semiconductor-excited solid laser.

15. A method of making a waterless lithographic printing plate according to claim 14, wherein said first layer contains at least one compound selected from the group consisting of iodonium salts, sulfonium salts, phosphonium citrate, oxysulfonates, dicarbodiimidosulfonates, and triazines.

16. A method of making a waterless lithographic printing plate according to claim 14, wherein said first layer contains at least one compound selected from the group consisting of azidodicarbonamide, sulfonyl hydrazine, and dinitropentamethylenetetramine.

17. A method of making a waterless lithographic printing plate according to claim 14, wherein the liquid having a surface tension of 25–50 dyn/$cm^2$ is at least one liquid selected from the group consisting of glycols, high-boiling point alcohols, high-boiling-point ethers, ketones, and esters.

18. A method of making a waterless lithographic printing plate according to claim 17, wherein said first layer contains at least one compound selected from the group consisting of azidodicarbonamide, sulfonyl hydrazine, and dinitropentamethylenetetramine.

19. A method of making a waterless lithographic printing plate according to claim 17, wherein said first layer contains at least one compound selected from the group consisting of iodonium salts, sulfonium salts, phosphonium citrate, oxysulfonates, dicarbodiimidosulfonates, and triazines.

20. A method of making a waterless lithographic printing plate according to claim 1, wherein said second layer having an ink-repellent surface includes at least one silicone rubber selected from the group consisting of a condensation silicone rubber, an addition silicone rubber, and a radiation-cured silicone rubber.

21. A method of making a waterless lithographic printing plate according to claim 1, wherein the liquid having a surface tension of 25–50 $dyn/cm^2$ is at least one liquid selected from the group consisting of glycols, high-boiling-point alcohols, high-boiling-point ethers, ketones, and esters.

22. A method of making a waterless lithographic printing plate according to claim 1, wherein said first layer is one of a deposited film having a thickness of 50 to 1,000 Å and a coated layer having a thickness of 0.05 to 10 $\mu$m.

23. A method of making a waterless lithographic printing plate according to claim 1, wherein said second layer is a coated layer having a thickness of 0.3 to 20 $\mu$m.

24. A method of making a waterless lithographic printing plate according to claim 2, wherein said second layer is a coated layer having a thickness of 0.3 to 20 $\mu$m.

* * * * *